(12) United States Patent
Tetelbaum et al.

(10) Patent No.: US 6,496,967 B1
(45) Date of Patent: Dec. 17, 2002

(54) METHOD OF DATAPATH CELL PLACEMENT FOR AN INTEGRATED CIRCUIT

(75) Inventors: Alexander Tetelbaum, Hayward, CA (US); Qiong J. Yu, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 95 days.

(21) Appl. No.: 09/805,642

(22) Filed: Mar. 13, 2001

(51) Int. Cl.$^7$ .................................................. G06F 9/45
(52) U.S. Cl. .............................. 716/10; 716/12; 716/16
(58) Field of Search .............................. 716/10, 12, 13, 716/14, 15, 16; 326/38, 39, 40, 41, 47

(56) References Cited

U.S. PATENT DOCUMENTS 6,049,224 A * 4/2000 Britton et al. ................ 326/41

* cited by examiner

*Primary Examiner*—Sara Crane
(74) *Attorney, Agent, or Firm*—Fitch, Even, Tabin & Flannery

(57) ABSTRACT

A method of datapath cell placement is disclosed that minimizes signal propagation time through a datapath macro and datapath macro area that includes the steps of receiving a datapath description of constrained input pins, unconstrained input pins, and output pins for a datapath block; assigning a first corresponding first cell level to a first datapath cell in a data path of a constrained input pin wherein the first corresponding first cell level is representative of a number of intervening datapath cells between the first datapath cell and the constrained input pin; assigning a second corresponding first cell level to a second datapath cell in a data path connecting the first datapath cell to an unconstrained input pin that is substantially identical to the first corresponding first cell level; and assigning a corresponding second cell level to the datapath cell in the data path connecting the first datapath cell to the unconstrained input pin wherein the second cell level is representative of a number of intervening datapath cells between the datapath cell in the data path of the unconstrained input pin and the unconstrained input pin.

5 Claims, 5 Drawing Sheets

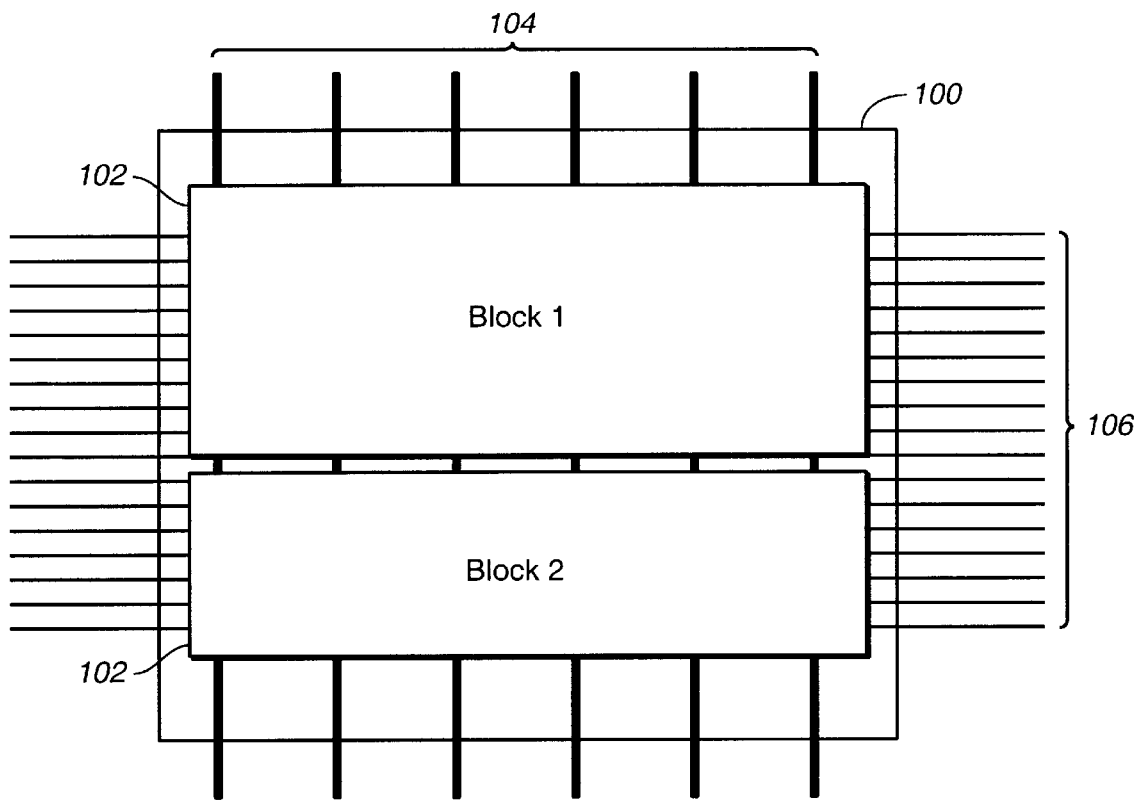
FIG._1 (PRIOR ART)
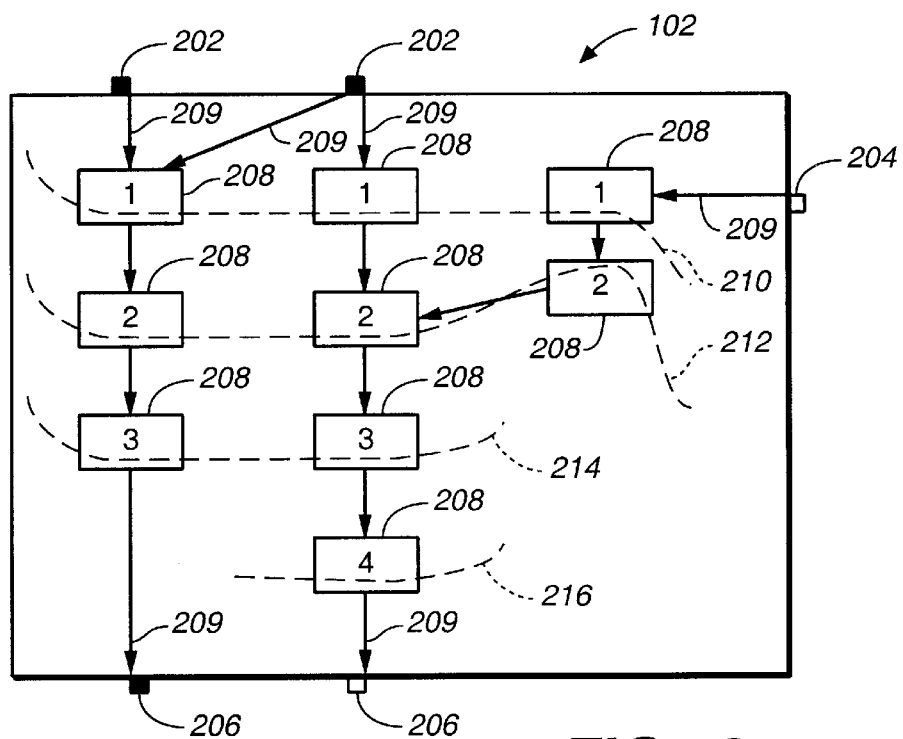
FIG._2

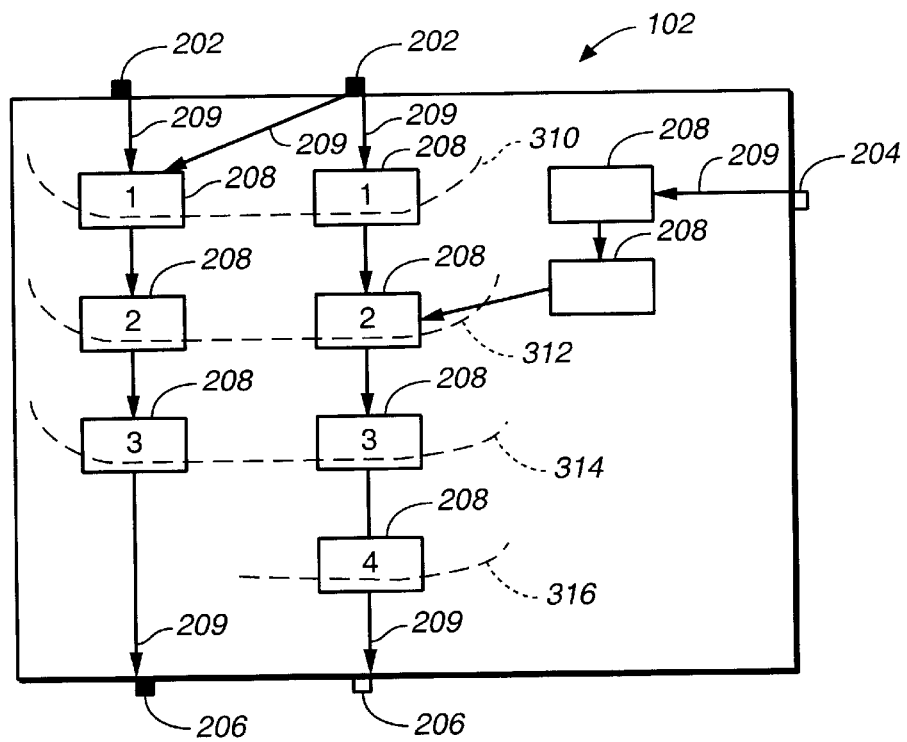
FIG._3
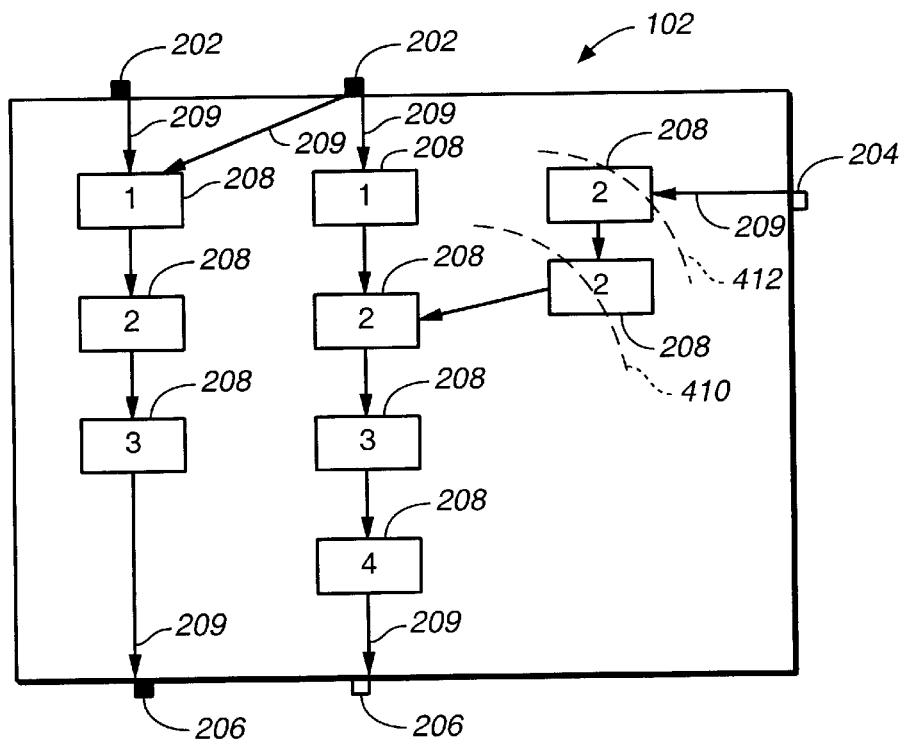
FIG._4

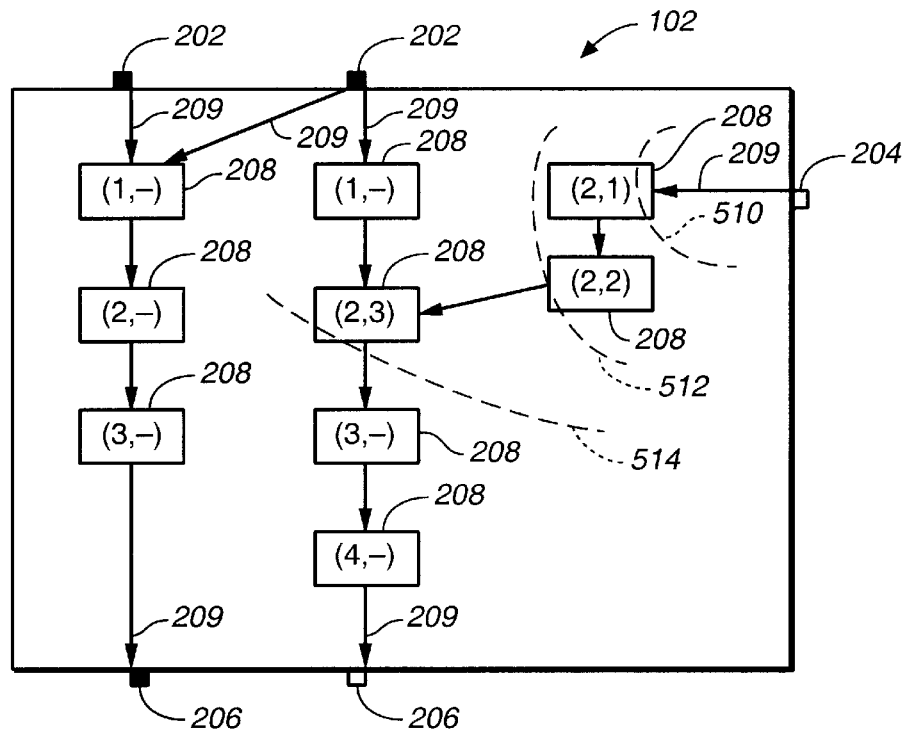
FIG._5
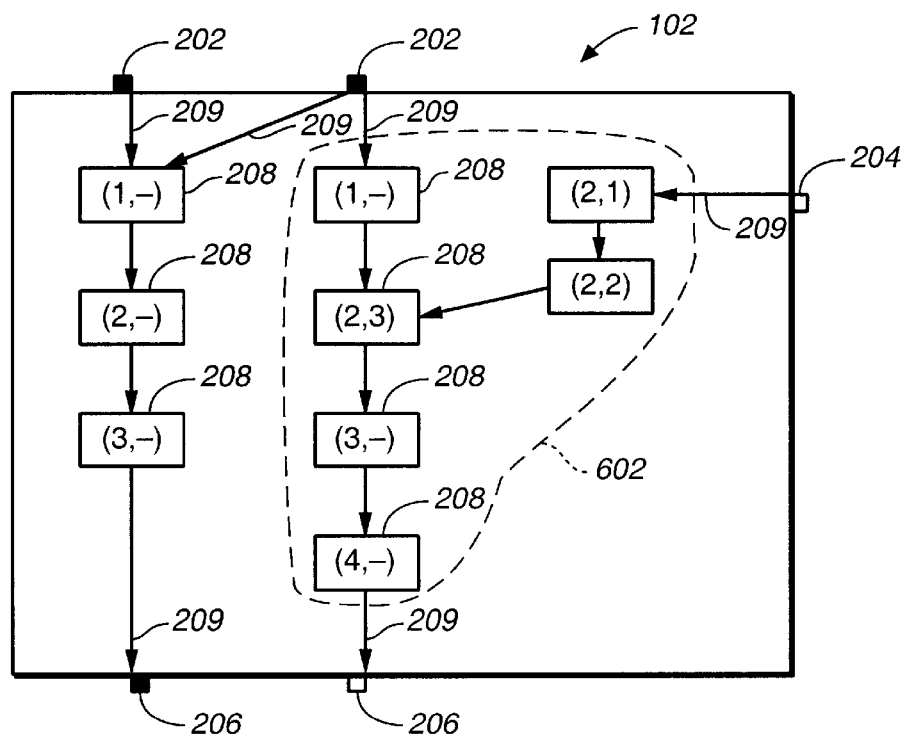
FIG._6

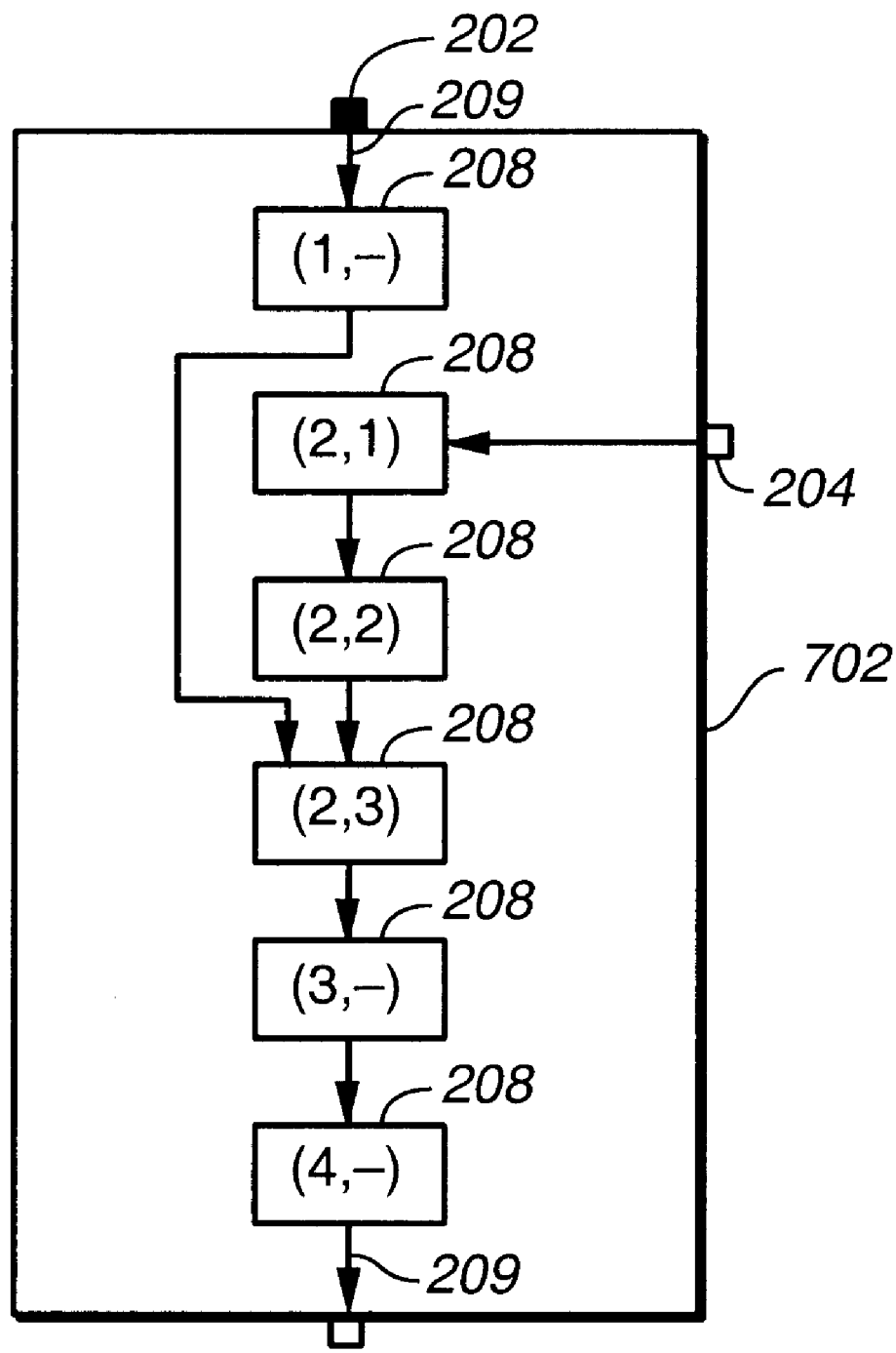
FIG._7

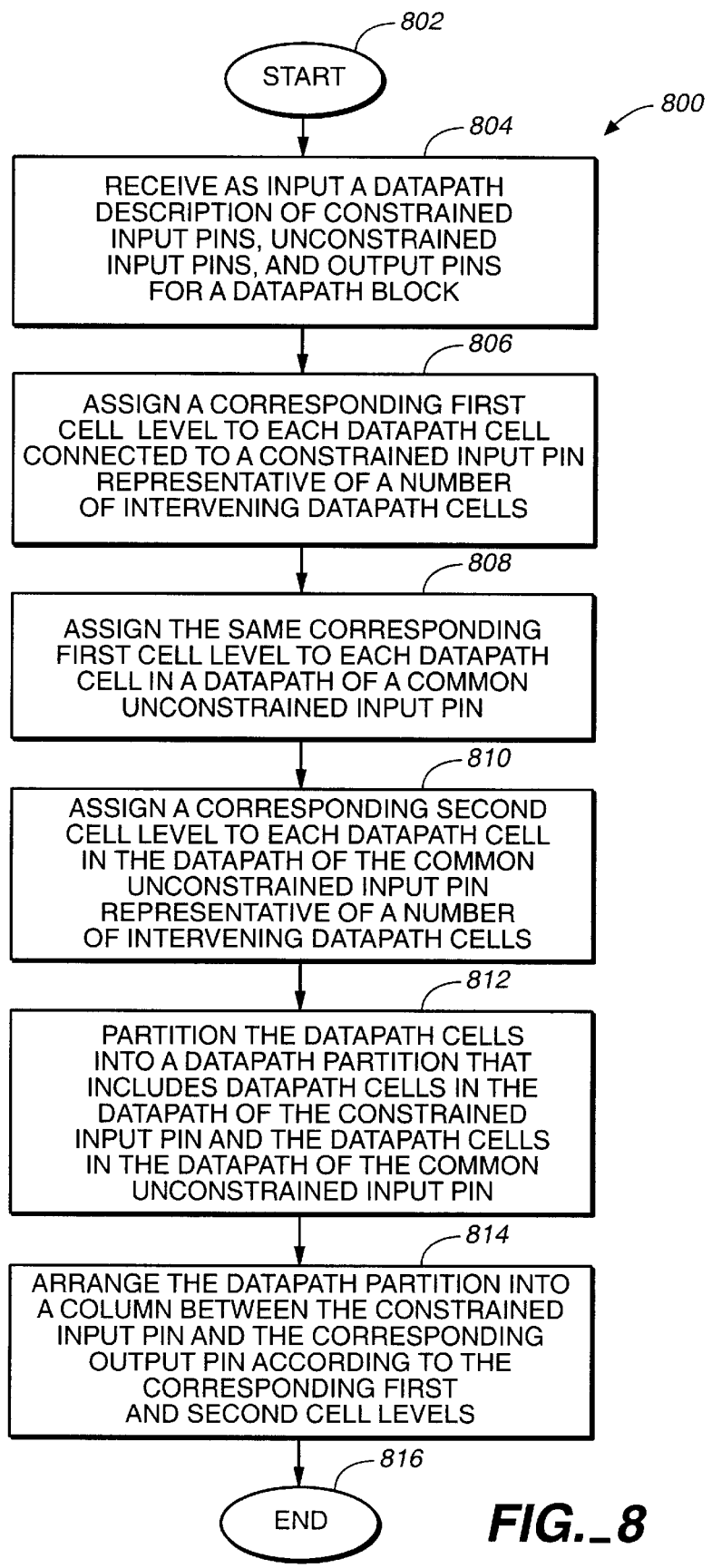
FIG._8

METHOD OF DATAPATH CELL PLACEMENT FOR AN INTEGRATED CIRCUIT

BACKGROUND OF THE INVENTION

The present invention relates generally to design tools for integrated circuits. More specifically, but without limitation thereto, the present invention relates to a method of placing datapath cells within a datapath macro to minimize signal propagation time and datapath macro area.

Integrated circuits typically include datapath macros. A datapath macro is an arrangement of datapath blocks connected by data buses and control signals. The data buses are generally routed orthogonally to the control signals. Each datapath block contains one or more datapath cells. Each of the datapath cells are connected to one or more of the data buses and to one or more of the control signals. As the size and complexity of the datapath macros and constituent datapath blocks increases, it becomes increasingly difficult for cell placement tools to arrange the datapath cells so that the signal propagation time through the datapath macro and the area of the datapath macro are minimized under complex input constraints imposed on the placement of cells, pins, nets, gaps between cells, and so on.

SUMMARY OF THE INVENTION

The present invention advantageously addresses the problems above as well as other problems by providing a method of datapath cell placement that minimizes signal propagation time and datapath macro area.

In one embodiment, the present invention may be characterized as a method of datapath cell placement that includes the steps of receiving a datapath description of constrained input pins, unconstrained input pins, and output pins for a datapath block; assigning a first corresponding first cell level to a first datapath cell in a data path of a constrained input pin wherein the first corresponding first cell level is representative of a number of intervening datapath cells between the first datapath cell and the constrained input pin; assigning a second corresponding first cell level to a second datapath cell in a data path connecting the first datapath cell to an unconstrained input pin that is substantially identical to the first corresponding first cell level; and assigning a corresponding second cell level to the datapath cell in the data path connecting the first datapath cell to the unconstrained input pin wherein the second cell level is representative of a number of intervening datapath cells between the datapath cell in the data path of the unconstrained input pin and the unconstrained input pin.

BRIEF DESCRIPTION OF THE DRAWINGS

The above and other aspects, features and advantages of the present invention will be more apparent from the following more specific description thereof, presented in conjunction with the following drawings wherein:

FIG. 1 is a diagram of a typical datapath macro structure of the prior art;

FIG. 2 is a diagram illustrating one of the datapath blocks contained within the datapath macro shown in FIG. 1;

FIG. 3 is the first in a series of diagrams illustrating a method of datapath cell placement for the datapath block of FIG. 2 according to an embodiment of the present invention;

FIG. 4 is the second in the series of diagrams beginning with FIG. 3;

FIG. 5 is the third in the series of diagrams beginning with FIG. 3;

FIG. 6 is the fourth in the series of diagrams beginning with FIG. 3;

FIG. 7 is the fifth in the series of diagrams beginning with FIG. 3; and

FIG. 8 is a flowchart of a method of datapath cell placement according to an embodiment of the present invention.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a diagram of a typical datapath macro structure 100 of the prior art. Shown in FIG. 1 are data blocks 102, data buses 104, and control signals 106. In this example, the datapath macro contains only two data blocks 102, however, more complex datapath macros may contain more. The data buses 104 are generally routed vertically through the data path macro 100, while the control signals 106 are generally routed horizontally. The data blocks 102 are arranged to include some or all of the data buses 102 and the control signals 104, depending on the functional requirements of each of the data blocks 102.

FIG. 2 is a diagram illustrating one of the datapath blocks 102 contained within the datapath macro shown in FIG. 1. Shown in FIG. 2 are constrained input pins 202, an unconstrained input pin 204, output pins 206, datapath cells 208, data paths 209, and forward fronts 210, 212, 214, and 216.

In this example, four of the datapath cells 208 are connected along a data path 209 to one of the constrained input pins 202 and a corresponding one of the output pins 206 and three of the datapath cells 208 are connected along a data path 209 to two of the constrained input pins 202. Two of the datapath cells 208 are not connected in a data path 209 of the constrained input pins 202 but are connected in a data path 209 to the unconstrained input pin 204. Other arrangements of any number of constrained input pins 202, unconstrained input pins 204, output pins 206, datapath cells 208, and data paths 209 within the datapath block 102 may be used to practice the present invention as described below.

Conventional methods for determining optimum datapath cell placement within the datapath block 102 typically perform forward front spreading to assign a cell level for each datapath cell 208. Forward front spreading is illustrated by the forward fronts 210, 212, 214, and 216. The forward front 210 passes through all of the datapath cells 208 (three, in this example) connected to at least one of the constrained input pins 202 or one of the unconstrained input pins 204 such that there are zero intervening datapath cells 208 between the constrained input pins 202 or the unconstrained input pins 204 and the forward front 210. The datapath cells 208 along the forward front 210 are each assigned a cell level of "1". The forward front 212 passes through all of the datapath cells 208 (three, in this example) such that there is one intervening datapath cell 208 between one of the constrained input pins 202 or one of the unconstrained input pins 204 and the forward front 212. The datapath cells 208 along forward front 212 are each assigned a cell level of "2". The forward front 214 passes through all of the datapath cells 208 (two, in this example) connected to at least one of the constrained input pins 202 or one of the unconstrained input pins 204 such that there are two intervening datapath cells 208 between the constrained input pins 202 or the unconstrained input pins 204 and the forward front 214. The datapath cells 208 along the forward front 214 are each assigned a cell level of "3". The forward front 216 passes through the datapath cells 208 (one, in this example) connected to at least one of the constrained input pins 202 or one of the unconstrained input pins 204 such that there are three intervening datapath cells 208 between the constrained input pins 202 or the unconstrained input pins 204 and the forward front 216. The datapath cells 208 along the forward front 216 are each assigned a cell level of "4". The cell level assignments are subsequently used to arrange the datapath cells 208 into columns between each constrained input pin 202 and corresponding output pin 206.

A problem with this approach is that the cell level does not depend on whether the input pin is constrained or unconstrained, failing to take into account the higher priority of assigning the constrained input pins to a lower cell level than the unconstrained input pins sharing the same level. On the other hand, if only constrained input pins are used to assign a cell level, then the datapath cells 208 that are connected to unconstrained input pins 204 and not to constrained input pins 202 are not assigned a cell level. Consequently, the datapath cells 208 that are not assigned a cell level may not be arranged in the optimum order to minimize signal propagation time through the datablock 102 and may increase the area required by the datapath macro 100.

FIG. 3 is the first in a series of diagrams illustrating a method of datapath cell placement for the datapath block of FIG. 2 according to an embodiment of the present invention. Shown in FIG. 3 are a data block 102, constrained input pins 202, an unconstrained input pin 204, output pins 206, datapath cells 208, data paths 209, and forward fronts 310, 312, 314, and 316.

The forward front 310 passes through all of the datapath cells 208 (two, in this example) in the data path 209 of at least one of the constrained input pins 202 such that there are zero intervening datapath cells 208 between the constrained input pins 202 and the forward front 310. The datapath cells 208 along the forward front 310 are each assigned a first cell level of "1". The forward front 312 passes through all of the datapath cells 208 (two, in this example) such that there is one intervening datapath cell 208 between one of the constrained input pins 202 and the forward front 312. The datapath cells 208 along the forward front 312 are each assigned a first cell level of "2". The forward front 314 passes through all of the datapath cells 208 (two, in this example) in the data path 209 of at least one of the constrained input pins 202 such that there are two intervening datapath cells 208 between the constrained input pins 202 and the forward front 314. The datapath cells 208 along the forward front 314 are each assigned a first cell level of "3". The forward front 316 passes through the datapath cells 208 (one, in this example) in the data path 209 of at least one of the constrained input pins 202 such that there are three intervening datapath cells 208 between the constrained input pins 202 and the forward front 316. The datapath cells 208 along the forward front 316 are each assigned a first cell level of "4".

FIG. 4 is the second in the series of diagrams beginning with FIG. 3. Shown in FIG. 4 are a data block 102, constrained input pins 202, an unconstrained input pin 204, output pins 206, datapath cells 208, data paths 209, and forward fronts 410 and 412. After assigning a first cell level to each of the datapath cells 208, another forward front spread is performed that includes each of the datapath cells 208 not yet assigned a first cell level. Each of the datapath cells 208 in a data path 209 of a common unconstrained input pin 204 is assigned the same first cell level as that assigned to the datapath cell 208 that lies in a data path 209 of the common unconstrained input pin 204 and in the data path 209 of at least one of the constrained input pins 202.

FIG. 5 is the third in the series of diagrams beginning with FIG. 3. Shown in FIG. 5 are a data block 102, constrained input pins 202, an unconstrained input pin 204, output pins 206, datapath cells 208, data paths 209, and backward fronts 510, 512, and 514. After assigning a first cell level to each of the datapath cells 208, a backward front spread is performed to assign a second cell level to each of the datapath cells 208 in the data path 209 of the common unconstrained input pin 204. The backward front spread is so called because the backward front 510 proceeds back from the datapath cell 208 closest to the unconstrained input pin 204 toward a constrained input pin 202. The backward front 510 passes through all of the datapath cells 208 (one, in this example) in the data path 209 of the common unconstrained input pin 204 such that there are zero intervening datapath cells 208 between the unconstrained input pin 204 and the backward front 510. The datapath cells 208 along the backward front 510 are each assigned a second cell level of "1". The backward front 512 passes through all of the datapath cells 208 (one, in this example) in the data path 209 of the common unconstrained input pin 204 such that there is one intervening datapath cell 208 between the unconstrained input pin 204 and the backward front 512. The datapath cells 208 along the backward front 512 are each assigned a second cell level of "2". The backward front 514 passes through all of the datapath cells 208 (one, in this example) in the data path 209 of the common unconstrained input pin 204 such that there are two intervening datapath cells 208 between the unconstrained input pin 204 and the backward front 514. The datapath cell 208 along the backward front 514 is assigned a second cell level of "3". The remaining datapath cells 208 that do not lie in a data path 209 of an unconstrained input pin 204 are assigned a null or "don't care" second cell level.

FIG. 6 is the fourth in the series of diagrams beginning with FIG. 3. Shown in FIG. 6 are a data block 102, constrained input pins 202, an unconstrained input pin 204, output pins 206, datapath cells 208, and a datapath cell partition 602. After assigning a first cell level and a second cell level to each of the datapath cells 208, the datapath cells 208 are each partitioned into a datapath cell partition 602. The datapath cell partition 602 includes the datapath cells 208 in the data path 209 of at least one of the constrained input pins 202 and a corresponding output pin 206 and the datapath cells 208 along a data path 209 from an unconstrained input pin 204.

FIG. 7 is the fifth in the series of diagrams beginning with FIG. 3. Shown in FIG. 7 are a constrained input pin 202, an unconstrained input pin 204, an output pin 206, datapath cells 208, and a datapath cell partition 602, and a datapath cell column 702. Each datapath cell partition 602 in FIG. 6 is arranged into a datapath cell column 702 according to the corresponding first and second cell levels. In this example, the datapath cells 208 are arranged in ascending order from the constrained input pin 202 to the corresponding output pin 206. If there is more than one datapath cell 208 having the same first cell level, then the datapath cells 208 having the same first cell level are arranged in order of ascending second cell level. This arrangement ensures the minimum data path length and corresponding propagation delay through the datapath block 102.

FIG. 8 is a flowchart 800 of a method of datapath cell placement according to an embodiment of the present invention.

Step 802 is the entry point of the flowchart 800.

In step 804, a datapath description of constrained input pins, unconstrained input pins, and output pins for a datapath block is received as input.

In step 806, a corresponding first cell level is assigned to each datapath cell in the data path of a constrained input pin representative of a number of intervening datapath cells between the first datapath cell and the constrained input pin.

In step 808, the same corresponding first cell level is assigned to each datapath cell in a data path connecting the first datapath cell to a common unconstrained input pin.

In step 810, a corresponding second cell level is assigned to each datapath cell in the data path connecting the first datapath cell to the common unconstrained input pin representative of a number of intervening datapath cells between the datapath cell in the data path of the unconstrained input pin and the unconstrained input pin.

In step 812, each datapath cell is partitioned into a datapath cell partition that includes the datapath cells in the data path of the constrained input pin and the datapath cells in the data path connecting one of the datapath cells in the data path of the constrained input pin to the unconstrained input pin.

In step 814, the datapath cell partition is arranged into a column between the constrained input pin and a corresponding output pin in a sequence determined by the corresponding first cell level and the corresponding second cell level of each datapath cell in the datapath cell partition.

Step 816 is the exit point for the flowchart 800.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of datapath cell placement comprising the steps of:

receiving a datapath description of constrained input pins, unconstrained input pins, and output pins for a datapath block;

assigning a first corresponding first cell level to a first datapath cell in a data path of a constrained input pin wherein the first corresponding first cell level is representative of a number of intervening datapath cells between the first datapath cell and the constrained input pin;

assigning a second corresponding first cell level to a second datapath cell in a data path connecting the first datapath cell to an unconstrained input pin that is substantially identical to the first corresponding first cell level; and assigning a corresponding second cell level to the datapath cell in the data path connecting the first datapath cell to the unconstrained input pin wherein the second cell level is representative of a number of intervening datapath cells between the datapath cell in the data path of the unconstrained input pin and the unconstrained input pin.

2. The method of claim 1 further comprising the step of partitioning each datapath cell into a datapath cell partition wherein the datapath cell partition includes datapath cells in a data path of the constrained input pin and datapath cells in a data path that connects a datapath cell in a data path of the constrained input pin to the unconstrained input pin.

3. The method of claim 2 further comprising the step of arranging the datapath cell partition into a datapath column between the constrained input pin and a corresponding output pin in a sequence determined by the corresponding first cell level and the corresponding second cell level of each datapath cell in the datapath cell partition.

4. The method of claim 3 wherein the datapath column is arranged to minimize signal propagation time through the datapath block.

5. The method of claim 3 wherein the datapath column is arranged to minimize datapath block area.

* * * * *